United States Patent
Konta

(10) Patent No.: US 12,087,553 B2
(45) Date of Patent: Sep. 10, 2024

(54) GAS SUPPLY RING AND SUBSTRATE PROCESSING APPARATUS

(71) Applicant: TOKYO ELECTRON LIMITED, Tokyo (JP)

(72) Inventor: Yoshitomo Konta, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 98 days.

(21) Appl. No.: 17/494,445

(22) Filed: Oct. 5, 2021

(65) Prior Publication Data
US 2022/0108873 A1 Apr. 7, 2022

(30) Foreign Application Priority Data

Oct. 5, 2020 (JP) .................................. 2020-168569
Aug. 18, 2021 (JP) .................................. 2021-133205

(51) Int. Cl.
*C23C 16/455* (2006.01)
*H01J 37/32* (2006.01)

(52) U.S. Cl.
CPC ... *H01J 37/3244* (2013.01); *H01J 2237/3342* (2013.01)

(58) Field of Classification Search
CPC ............... C23C 16/227; C23C 16/455; C23C 16/45561; C23C 16/45563; C23C 16/4558; C23C 16/45587; C23C 16/45591; H01J 37/321; H01J 37/3244; H01J 37/32449; H01J 2237/3342; H01L 21/67063
See application file for complete search history.

(56) References Cited

U.S. PATENT DOCUMENTS

| | | | | |
|---|---|---|---|---|
| 5,851,294 | A * | 12/1998 | Young | C23C 16/4558 156/345.33 |
| 6,486,081 | B1 * | 11/2002 | Ishikawa | C23C 16/45578 438/789 |
| 7,722,737 | B2 * | 5/2010 | Gondhalekar | C23C 16/4558 156/345.33 |
| 7,806,078 | B2 * | 10/2010 | Yoshida | C23C 16/45563 118/723 R |
| 10,008,368 | B2 * | 6/2018 | Rozenzon | C23C 16/45563 |
| 2004/0099378 | A1 * | 5/2004 | Kim | C23C 16/4558 156/345.33 |
| 2004/0168769 | A1 * | 9/2004 | Matsuoka | C23C 16/4404 156/345.33 |

(Continued)

FOREIGN PATENT DOCUMENTS

JP 2006-086449 A 3/2006

*Primary Examiner* — Benjamin Kendall
*Assistant Examiner* — Joshua Reyes
(74) *Attorney, Agent, or Firm* — XSENSUS LLP

(57) ABSTRACT

A gas supply ring for use in a substrate processing apparatus includes an inner face, an outer face, a first face between the inner face and the outer face, and a second face between the inner face and the outer face and opposite to the first face. The outer face has at least one gas inlet and the first face has an outer groove in communication with the at least one gas inlet. The second face has first and second middle grooves in communication with the outer groove. The first face further has first to fourth inner grooves disposed medial to the outer groove. The inner face has a plurality of gas outlets and each of the gas outlets is in communication with any one of the first to fourth inner grooves.

20 Claims, 7 Drawing Sheets

(56) References Cited

U.S. PATENT DOCUMENTS

| | | | |
|---|---|---|---|
| 2004/0217217 A1* | 11/2004 | Han | C23C 16/4558 239/589 |
| 2013/0284700 A1* | 10/2013 | Nangoy | B05B 1/185 239/553.3 |
| 2015/0176125 A1* | 6/2015 | Nozawa | C23C 16/45561 118/715 |
| 2019/0122868 A1* | 4/2019 | Yamashita | H01J 37/32633 |

* cited by examiner

GAS SUPPLY RING AND SUBSTRATE PROCESSING APPARATUS

CROSS-REFERENCE TO RELATED APPLICATIONS

This application claims priority to Japanese Patent Application Nos. 2020-168569 and 2021-133205, filed on Oct. 5, 2020 and Aug. 18, 2021, respectively, the entire contents of which are incorporated herein by reference.

TECHNICAL FIELD

The present disclosure relates to a gas supply ring and a substrate processing apparatus.

BACKGROUND

In a substrate processing apparatus, in order to perform plasma processing or the like, a gas used for processing is introduced into a chamber from an annular gas introducing member disposed on a sidewall of the chamber. (see Japanese Patent Application Publication No. 2006-086449)

SUMMARY

The present disclosure provides a compact gas supply ring having a plurality of flow paths, and a substrate processing apparatus including the gas supply ring.

One aspect of the present disclosure provides a gas supply ring for use in a substrate processing apparatus comprising an inner face, an outer face, a first face between the inner face and the outer face, and a second face between the inner face and the outer face and opposite to the first face. The outer face has at least one gas inlet, the first face has an outer groove in communication with the at least one gas inlet, the second face has first and second middle grooves in communication with the outer groove, the first face further has first to fourth inner grooves disposed medial to the outer groove, the first and second inner grooves are in communication with the first middle groove, the third and fourth inner grooves are in communication with the second middle groove, the inner face has a plurality of gas outlets, and each of the gas outlets is in communication with any one of the first to fourth inner grooves.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a gas supply ring and a substrate processing apparatus of the present disclosure will be described in detail with reference to the accompanying drawings. The following embodiments are not intended to limit the present disclosure.

In order to uniformly discharge a gas into a chamber from a plurality of outlets of a gas supply ring, it may be required to obtain a uniform conductance in a plurality of flow paths. Therefore, in one example, distances from a gas inlet of the gas supply ring to the plurality of gas outlets can be made equal. A flow path branched in a so-called tournament manner is known as a method of obtaining a uniform conductance in the plurality of flow paths. When the gas supply ring has the tournament type flow path, as the number of the outlets increases, the number of branched flow paths increases and the gas ring is widened in a radial direction. Therefore, it is expected to provide a compact gas supply ring having a plurality of flow paths and a substrate processing apparatus including the gas supply ring. Also, it is expected to provide a gas supply ring having a plurality of flow paths that can be easily cleaned and a substrate processing apparatus including the gas supply ring.

(Configuration of Substrate Processing Apparatus 10)

Figure 1:
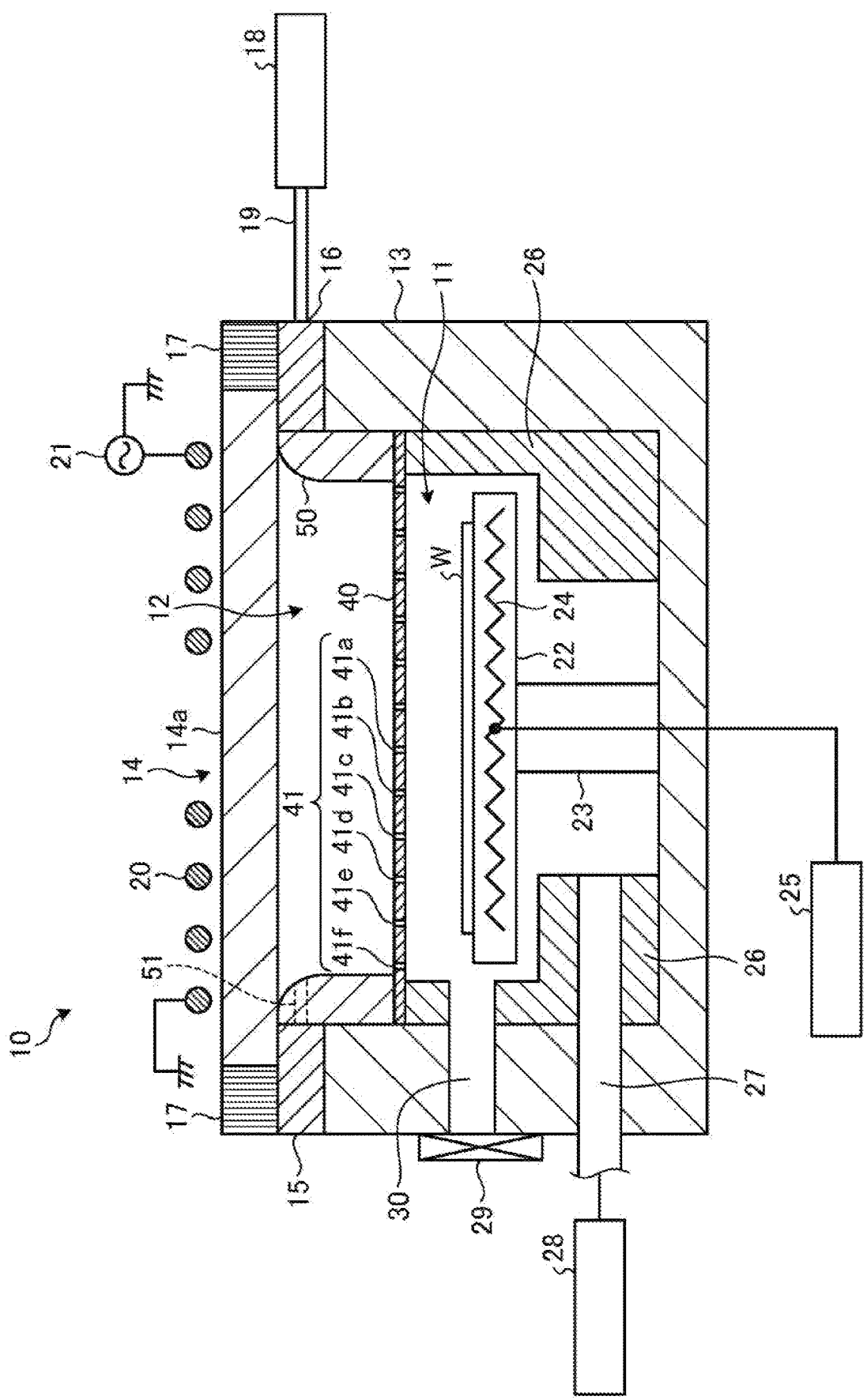
FIG. 1 shows an example of a substrate processing apparatus according to an embodiment of the present disclosure.

FIG. 1 shows an example of a substrate processing apparatus according to an embodiment of the present disclosure. A substrate processing apparatus 10 shown in FIG. 1 is an example of a plasma processing apparatus for performing plasma processing such as an ashing process for ashing and removing a photoresist film (to be etched) on a wafer W as a substrate to be processed.

The substrate processing apparatus 10 includes a processing chamber 11 for processing the wafer W, and a plasma generation chamber 12 in which a gas is excited to generate plasma and in communication with the processing chamber 11. The plasma generation chamber 12 is disposed above the processing chamber 11 via a partition member 40, and plasma of a gas is formed by an inductively coupled plasma (ICP) method.

The processing chamber 11 and the plasma generation chamber 12 are defined by a substantially cylindrical reaction chamber 13 made of a metal, e.g., aluminum, or the like. A gas ring 15 and a lid 14 are disposed above the reaction chamber 13. In other words, the gas ring 15 is disposed to be divided between the reaction chamber 13 and the lid 14 on a sidewall of the reaction chamber 13. The lid 14 includes a substantially disc-shaped member 14a made of an insulating material such as quartz, ceramic, or the like, and a substantially annular member 17 disposed around the lid 14 and made of a metal such as aluminum or the like. The plasma generation chamber 12 is airtightly closed by the reaction chamber 13, the gas ring 15, and the lid 14.

The gas ring 15 is formed in an annular shape and has a gas inlet 16 on an outer peripheral side thereof. The gas ring 15 is an example of the gas supply ring. A gas supplier 18 is connected to the gas inlet 16 through a line 19. The gas supplied from the gas supplier 18 flows into the flow path in the gas ring 15 through the line 19 and the gas inlet 16, and is introduced into an inner space of the plasma generation chamber 12 from the plurality of gas outlets. The gas supplier 18 is provided with an on-off valve for releasing and stopping the supply of the gas, a mass flow controller for controlling a flow rate of the gas, or the like. In the present embodiment, an example in which a mixed gas of hydrogen ($H_2$) gas and argon (Ar) gas is supplied from the gas supplier 18 is described. However, the type of the gas is not limited thereto.

A coil 20 as an antenna member is wound above the reaction chamber 13. A radio frequency power supply 21 is connected to the coil 20. The radio frequency power supply 21 outputs a power having a frequency of 300 kHz to 60 MHz to the coil 20. Accordingly, an induced electromagnetic field is generated in the plasma generation chamber 12, the gas introduced into the plasma generation chamber 12 is excited to form plasma.

A substrate support 22 on which the wafer W is placed is disposed in the processing chamber 11. The substrate support 22 is supported by a support member 23 disposed at a bottom portion of the processing chamber 11. The substrate support 22 is made of, e.g., alumite-treated aluminum. A heater 24 for heating the wafer W may be embedded in the substrate support 22. The heater 24 heats the wafer W to a predetermined temperature (e.g., 300° C.) by a power supplied from a heater power supply 25. The temperature at this time can be set to a temperature at which the film to be etched on the wafer W is not significantly damaged, e.g., within the range of 250° C. to 400° C.

A liner 26 for protecting an inner wall of the processing chamber 11 is disposed in the processing chamber 11. The liner 26 is made of, e.g., aluminum. An exhaust port 27 is connected to an exhaust device 28 including a vacuum pump while penetrating through the sidewalls of the liner 26 and the processing chamber 11. Accordingly, the pressures in the processing chamber 11 and the plasma generation chamber 12 can be reduced to a predetermined vacuum level by operating the exhaust device 28.

Further, a loading/unloading port 30 that can be opened and closed by a gate valve 29 is formed on the sidewall of the processing chamber 11. The wafer W is loaded and unloaded by a transfer mechanism such as a transfer arm (not shown) or the like.

Multiple through holes 41 are formed in a partition wall member 40 that partitions the processing chamber 11 and the plasma generation chamber 12. The partition wall member 40 has, e.g., a plurality of through holes 41a to 41e concentrically disposed in that order from an inner peripheral side, and a plurality of through holes 41f formed at an outermost periphery. The multiple through holes 41a to 41f are collectively referred to as the through holes 41.

The partition wall member 40 allows radicals in the plasma generated in the plasma generation chamber 12 to reach the processing chamber 11 through the through holes 41. In other words, when the gas is excited in the plasma generation chamber 12 to form plasma, radicals, ions, ultraviolet light and the like are generated. The partition member 40 is made of quartz or the like, and shields ions and ultraviolet light in the plasma generated in the plasma generation chamber 12 to allow only radicals to reach the processing chamber 11.

On the sidewall of the reaction chamber 13, a ring-shaped member 50 made of, e.g., quartz, is disposed to cover the sidewall of the reaction chamber 13. The upper portion of the ring-shaped member 50 is rounded such that an inner diameter gradually increases toward an inner side. The inner wall of the ring-shaped member 50 is adjacent to the through-hole 41f without blocking the outermost through hole 41f of the partition wall member 40. Further, a plurality of gas outlets 51 is disposed at the upper portion of the ring-shaped member 50 to correspond to the plurality of gas outlets ports of the gas ring 15.

In the substrate processing apparatus 10 configured as described above, in order to perform plasma processing on the wafer W, first, the gate valve 29 is opened, and the wafer W is loaded into the processing chamber 11 from the loading/unloading port 30 and placed on the substrate support 22.

Next, the gate valve 29 is closed, and the inside of the processing chamber 11 and the inside of the plasma generation chamber 12 are exhausted by the exhaust device 28 to a predetermined depressurized state. Further, a predetermined power is supplied from the heater power supply 25 to the heater 24 so that the wafer W reaches a predetermined temperature (e.g., 300° C.).

Then, hydrogen gas and argon gas are supplied from the gas supplier 18 into the plasma generation chamber 12 through the line 19 and the flow path in the gas ring 15. A radio frequency power of, e.g., 4000 W, is supplied from the radio frequency power supply 21 to the coil 20 to generate an induced electromagnetic field in the plasma generation chamber 12. Thus, plasma of the hydrogen gas and the argon gas are formed in the plasma generation chamber 12. The ultraviolet light and the ions in the generated plasma are shielded by the partition member 40, and the radicals pass through the partition member 40. Accordingly, the surface of the wafer W in the processing chamber 11 can be subjected to desired processing such as asking of the photoresist film on the wafer W or the like by the radicals without being damaged by the ultraviolet light and the hydrogen ions.

(Flow Path in the Gas Ring 15)

Figure 2:
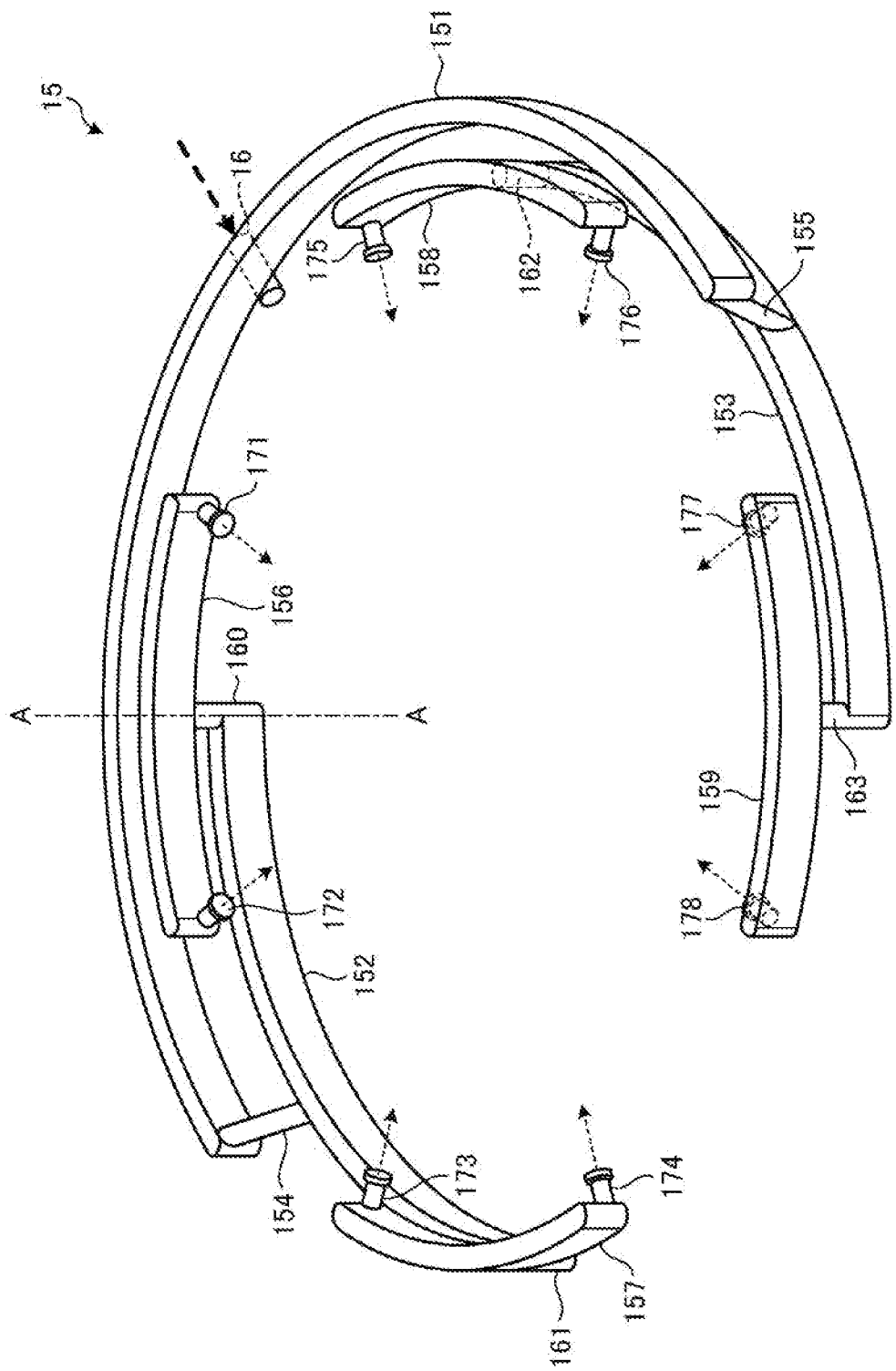
FIG. 2 shows an example of flow paths in a gas ring according to the embodiment.

FIG. 2 shows an example of flow paths in the gas ring according to the embodiment. As shown in FIG. 2, flow paths 151 to 163 are formed in the gas ring 15 such that the conductance from the gas inlet 16 to gas outlets 171 to 178 becomes equal at the time of installation of the gas ring 15. In other words, the distances of the flow paths from the gas inlet 16 to the gas outlets 171 to 178 are equal. In the following description, it is assumed that the end includes the vicinity of the end. Further, the angles such as 180°, 90° and 45° include angles close thereto.

The flow path 151 extends in an arcuate shape over an angle of 180° in a circumferential direction of the gas ring 15. The flow path 151 has a central portion connected to the gas inlet 16 and both ends connected to the flow paths 154 and 155. In other words, the flow path 151 is branched in two directions into two parts having the same length when viewed from the gas inlet 16. Each of the flow paths 152 and 153 extends in an arcuate shape over an angle of 90° in the circumferential direction of the gas ring 15. The flow path 152 has a central portion connected to the flow path 154 and both ends connected to the flow paths 160 and 161. In other words, the flow path 152 is branched in two directions into two parts having the same length when viewed from the flow path 154. The flow path 153 has a central portion connected to the flow path 155 and both ends connected to the flow paths 162 and 163. In other words, the flow path 153 is branched in two directions into two parts having the same length when viewed from the flow path 155.

Each of the flow paths 156 to 159 extends in an arcuate shape over an angle of 45° in the circumferential direction of the gas ring 15. The flow path 156 has a central portion connected to the flow path 160 and both ends connected to the gas outlets 171 and 172. In other words, the flow path 156 is branched in two directions into two parts having the same length when viewed from the flow path 160. The flow path 157 has a central portion connected to the flow path 161 and both ends connected to the gas outlets 173 and 174. In other words, the flow path 157 is branched in two directions into two parts having the same length when viewed from the flow path 161. The flow path 158 has a central portion connected to the flow path 162 and both ends connected to the gas outlets 175 and 176. In other words, the flow path 158 is branched in two directions into two parts having the same length when viewed from the flow path 162. The flow path 159 has a central portion connected to the flow path 163 and both ends connected to the gas outlets 177 and 178. In other words, the flow path 159 is branched in two directions into two parts having the same length when viewed from the flow path 163. Further, the flow paths 154, 155, 160 to 163 are examples of a vertical through hole.

Figure 3:
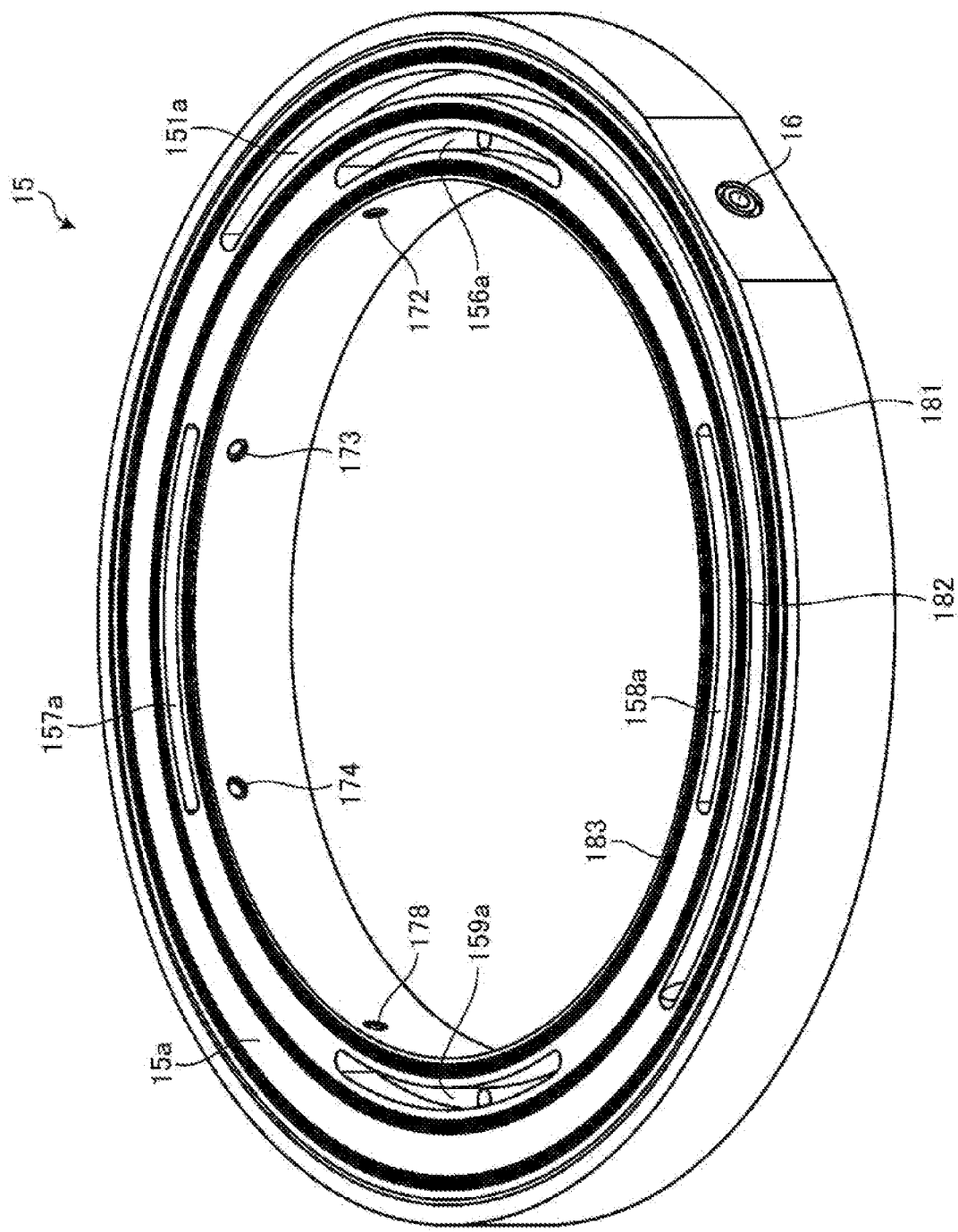
FIG. 3 is a perspective view showing an example of an upper surface of the gas ring according to the embodiment.
Figure 4:
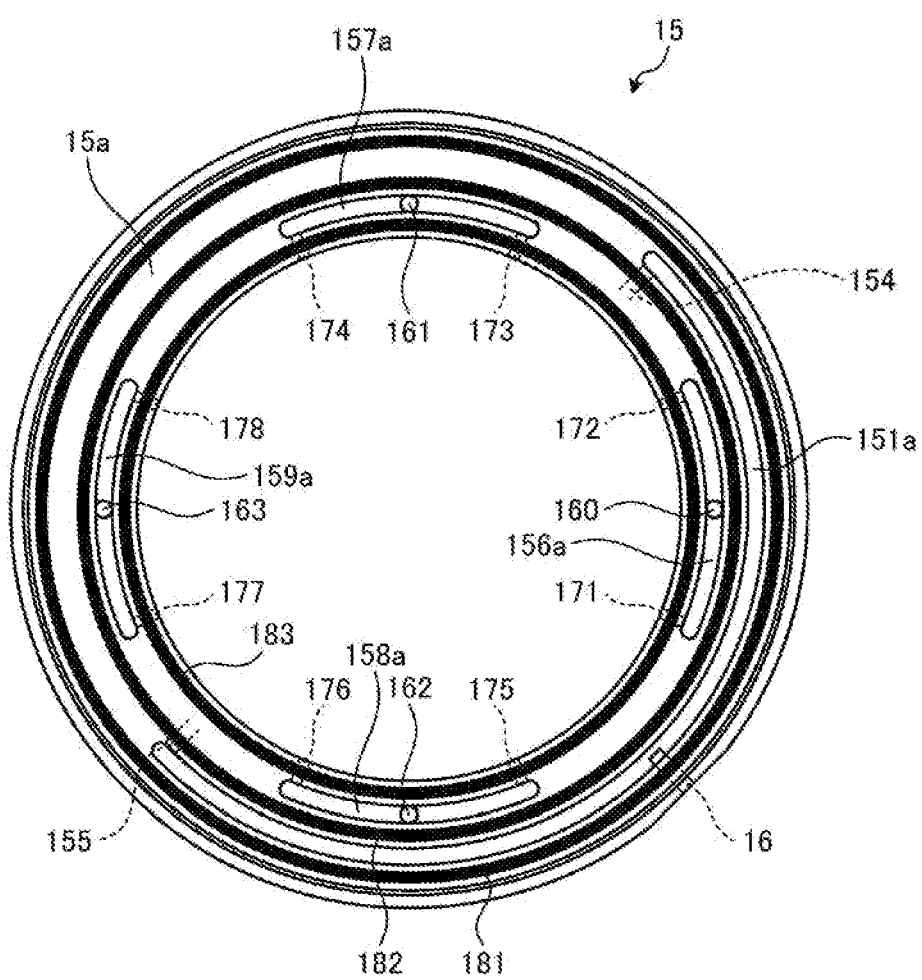
FIG. 4 is a top view showing an example of the upper surface of the gas ring according to the embodiment.
Figure 5:
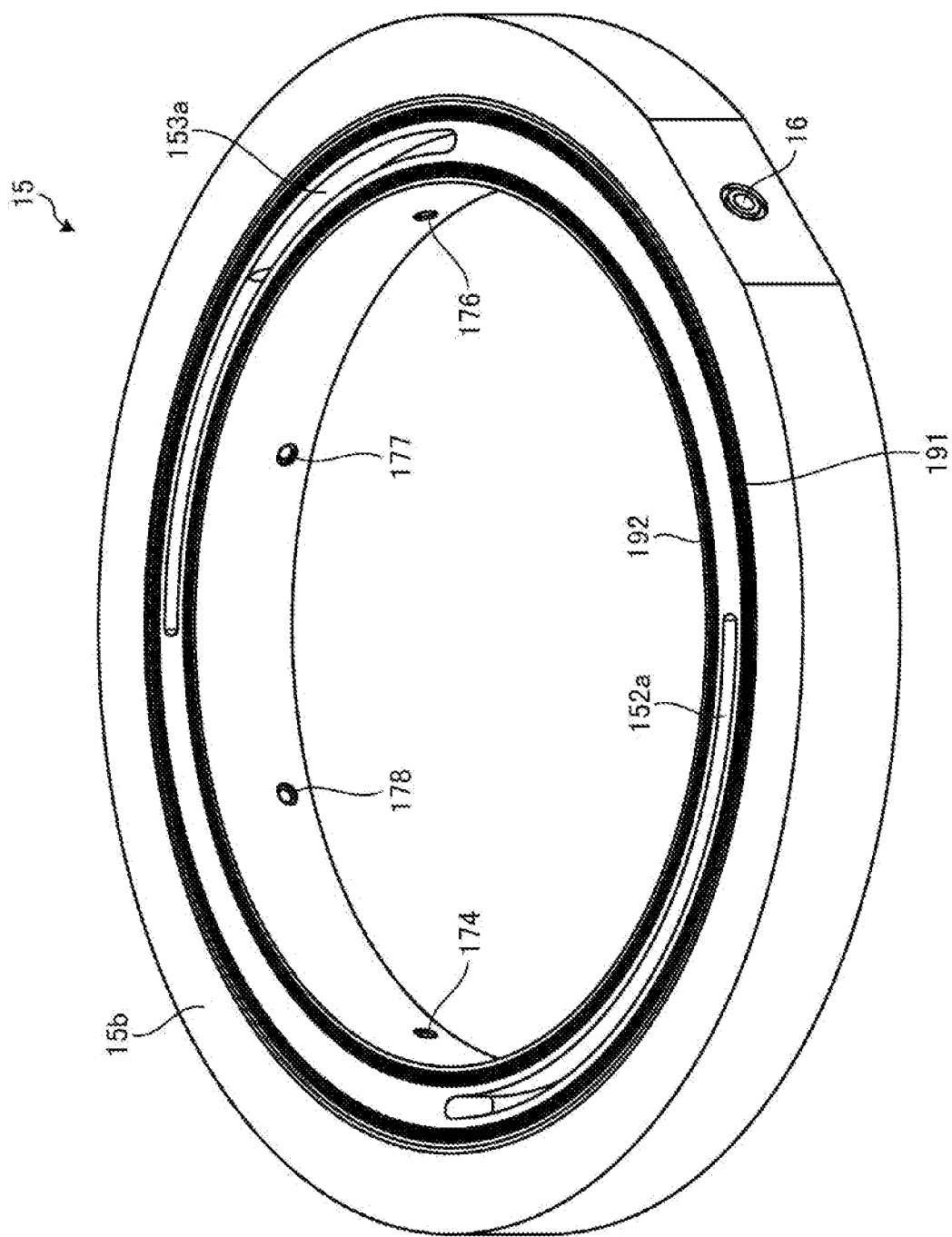
FIG. 5 is a perspective view showing an example of a bottom surface of the gas ring according to the embodiment.
Figure 6:
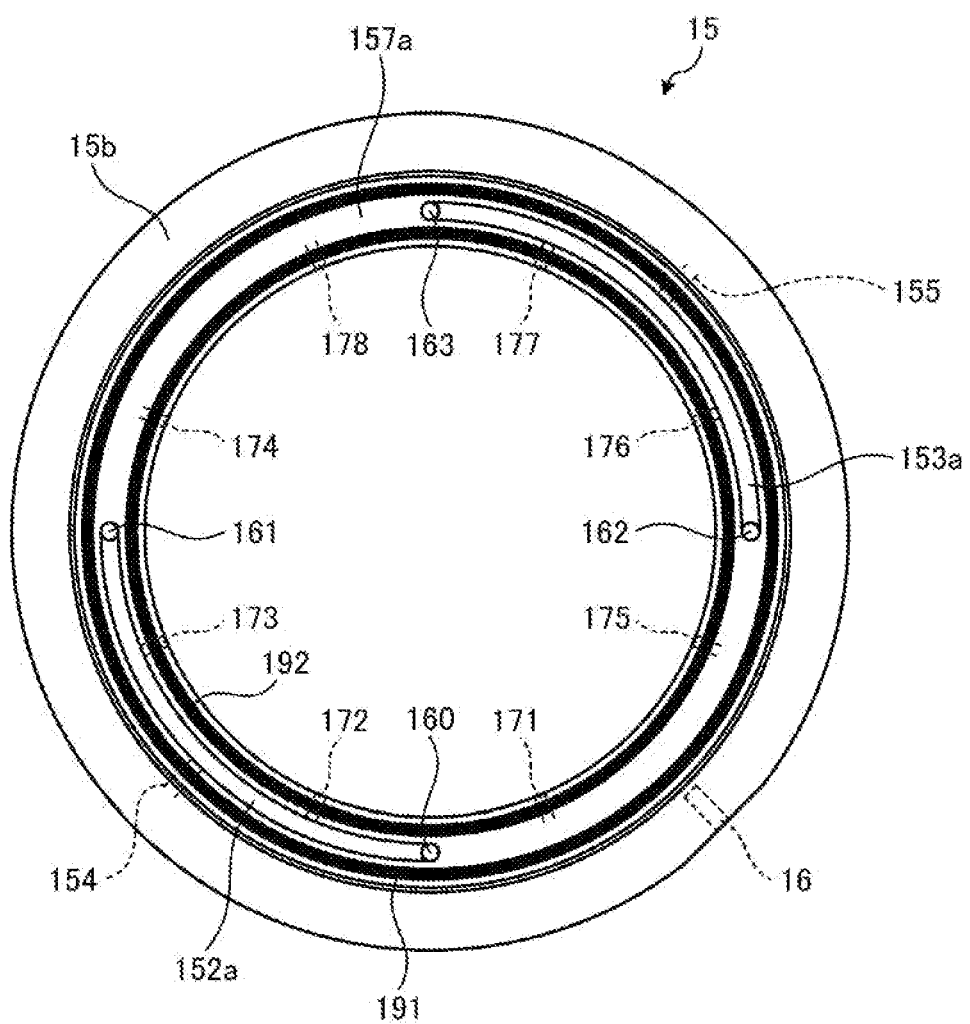
FIG. 6 is a bottom view showing an example of the bottom surface of the gas ring according to the embodiment.

Next, the structure of the gas ring 15 will be described with reference to FIGS. 3 to 6. FIG. 3 is a perspective view showing an example of the upper surface of the gas ring according to the embodiment. FIG. 4 is a top view showing an example of the upper surface of the gas ring according to the embodiment. FIG. 5 is a perspective view showing an example of the bottom surface of the gas ring according to the embodiment. FIG. 6 is a bottom view showing an example of the bottom surface of the gas ring according to the embodiment. As shown in FIGS. 3 to 6, the gas ring 15 has a groove on each of an upper surface 15a in contact with the bottom surface of the substantially annular member 17 of the lid 14 and a bottom surface 15b in contact with the upper surface of the sidewall of the reaction chamber 13. The groove of the gas ring 15 is in contact with the bottom surface of the substantially annular member 17 or the upper surface of the sidewall of the reaction chamber 13, thereby forming a flow path. The substantially annular member 17 of the lid 14 is an example of a first annular member, and the sidewall of the reaction chamber 13 is an example of a second annular member. Further, the upper surface 15a is an example of a first face between an inner face and an outer face of the gas ring 15, and the bottom surface 15b is an example of a second face between the inner face and the outer face of the gas ring 15.

Grooves 151a and 156a to 159a are concentrically formed on the upper surface 15a. Further, the grooves 156a to 159a are separately formed on the same concentric circle. Further, the groove 151a is an example of an outer groove or a first arcuate groove, and the grooves 156a to 159a are examples of first to fourth inner grooves, respectively. An O-ring 181 is disposed between the outer face of the gas ring 15 and the groove 151a. An O-ring 182 is disposed between the groove 151a and the grooves 156a to 159a. An O-ring 183 is disposed between the grooves 156a to 159a and the inner face of the gas ring 15. In other words, the flow paths 151 and 156 to 159 corresponding to the grooves 151a and 156a to 159a are formed by the bottom surface of the substantially annular member 17 of the lid 14, the O-rings 181 to 183, and any one of the grooves 151a and 156a to 159a. The gas inlet 16 is connected to the central portion in the circumferential direction of the outer groove 151a. The gas inlet 16 is an example of at least one gas inlet on the outer face of the gas ring 15. Similarly, the gas outlets 171 to 178 are connected to both ends of the grooves 156a to 159a, respectively. In other words, the gas outlets 171 to 178 are disposed at equal intervals along the circumferential direction of the gas ring 15. The gas outlets 171 to 178 are examples of first to eighth gas outlets.

On the bottom surface 15b, the grooves 152a and 153a are separately formed on the same concentric circle. The grooves 152a and 153a are examples of first and second middle grooves or a second arcuate groove. An O-ring 191 is disposed between the outer face of the gas ring 15 and the grooves 152a and 153a. An O-ring 192 is disposed between the grooves 152a and 153a and the inner face of the gas ring 15. In other words, the flow paths 152 and 153 respectively corresponding to the grooves 152a and 153a are formed by the upper surface of the sidewall of the reaction chamber 13, the O-rings 191 and 192, and any one of the grooves 152a and 153a.

Figure 7:
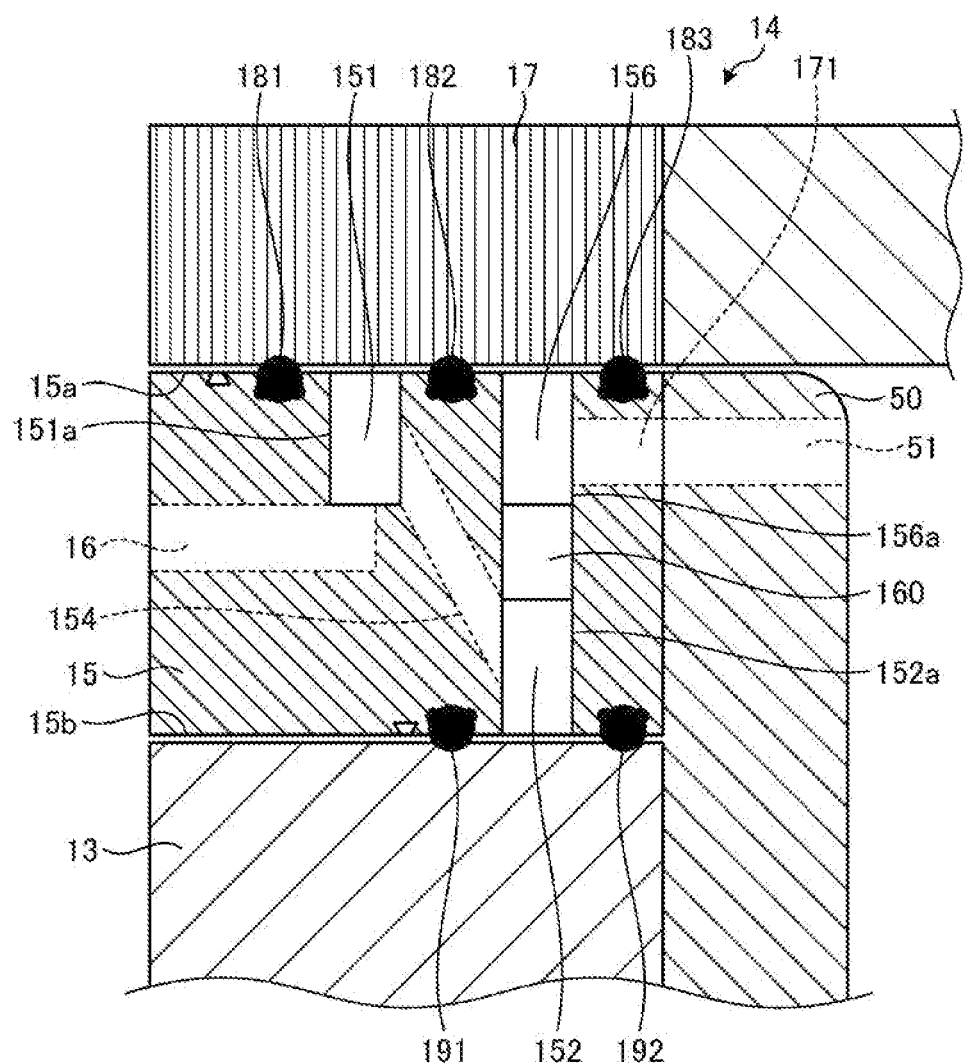
FIG. 7 shows an example of a cross section of the gas ring according to the embodiment during installation thereof.

Next, a cross section of the gas ring 15 at the time of installation thereof will be described with reference to FIG. 7. FIG. 7 shows an example of a cross section of the gas ring according to the embodiment at the time of installation thereof. FIG. 7 is a cross-sectional view of an A-A plane shown in FIG. 2. As shown in FIG. 7, the gas ring 15 is disposed between the upper surface of the sidewall of the reaction chamber 13 and the bottom surface of the substantially annular member 17 of the lid 14. Further, the ring-shaped member 50 is disposed on the inner peripheral sides of the reaction chamber 13 and the gas ring 15.

In the state shown in FIG. 7, on the upper surface 15a, the O-rings 181 to 183 are in close contact with the bottom surface of the substantially annular member 17 of the lid 14, and the flow paths 151 and 156 corresponding to the outer grooves 151a and 156a are in an airtight state with respect to the outside. Similarly, on the bottom surface 15b, the O-rings 191 and 192 are in close contact with the upper surface of the sidewall of the reaction chamber 13, and the flow path 152 corresponding to the groove 152a is in an airtight state with respect to the outside. The gas inlet 16 is connected to the flow path 151 in a direction substantially parallel to the upper surface 15a at a position different from the A-A plane. The flow path 154 diagonally connects the flow path 151 on the upper surface 15a side and the flow path 152 on the bottom surface 15b side at a position different from the A-A plane. The flow path 160 connects the flow path 152 on the bottom surface 15b side and the flow path 156 on the upper surface 15a side on the A-A plane. The flow path 156 is connected to the gas outlet 171 in a direction substantially parallel to the upper surface 15a at a position different from the A-A plane. The gas outlet 171 is connected to the gas outlet 51 disposed at the ring-shaped member 50.

As shown in FIG. 7, the flow paths are alternately disposed on the upper surface 15a and the bottom surface 15b in a concentric shape with the flow path 151 of the upper surface 15a, the flow path 152 of the bottom surface 15b, and the flow path 156 of the upper surface 15a from the outer peripheral side of the gas ring 15. Therefore, the flow paths can be maintained in an airtight state by the O-rings 181 to 183, 191 and 192. In other words, by closing an upper unit such as the lid 14 or the like at the time of installation of the gas ring 15, the sealing of the processing chamber 11 and the plasma generation chamber 12 and the formation of the flow path for introducing the gas can be performed at the same time. Since the flow paths are alternately disposed on the upper surface 15a and the bottom surface 15b, a tournament type flow path can be constructed in a narrow space in the radial direction of the gas ring 15. When a larger number of gas outlets are provided, the tournament hierarchy can be increased by repeating the alternate arrangement of the flow paths on the upper surface 15a and the bottom surface 15b, and the gas outlets can be provided to correspond to the tournament hierarchy. When the flow paths are alternately disposed on the upper surface 15a and the bottom surface 15b, the flow paths may be disposed on concentric circles having the same radius on the upper surface 15a and the bottom surface 15b. In this case, the flow path on the upstream side close to the gas inlet 16 is defined as the flow path on the outer peripheral side.

Further, in manufacturing the gas ring 15, the grooves 151a to 153a and 156a to 159a and the flow paths 154, 155, and 160 to 163 forming the flow paths 151 to 163 can be easily formed by machining or the like from the outside without using diffusion bonding or welding for the formation of the flow path. Since welding is not used, the risk of contamination can be reduced. Further, the gas ring 15 can be removed during maintenance, so that the grooves 151a to 153a and 156a to 159a, and the flow paths 154, 155, 160 to 163 can be easily cleaned. Although diffusion bonding or welding is not used for the formation of the flow paths in the present embodiment, in another embodiment, diffusion bonding may be used to form the flow path without against the purpose of forming the compact flow path.

In the above-described embodiment, one gas inlet 16 is provided. However, the present disclosure is not limited thereto. For example, the gas inlets 16 may be disposed in line symmetrical positions with respect to the gas ring 15, and the flow paths alternately disposed on the upper surface 15a and the bottom surface 15b may be concentrically arranged, thereby constituting two systems of flow paths.

In the above-described embodiment, the grooves 151a to 153a and 156a to 159a have a square cross section. However, the present disclosure is not limited thereto. For example, the grooves may have a semi-circular cross section.

In the above-described embodiment, the grooves 156a to 159a of the upper surface 15a and the grooves 152a and 153a of the bottom surface 15b are disposed in concentric circles having the same radius, but the present invention is not limited thereto. For example, the grooves 151a of the upper surface 15a and the grooves 152a and 153a of the bottom surface 15b may be disposed in concentric circles having the same radius, and the grooves 156a to 159a of the upper surface 15a may be disposed in concentric circles having a smaller radius.

In accordance with the present embodiment, the gas supply ring (the gas ring 15) used in the substrate processing apparatus 10 include the inner face, the outer face, the first face (the upper surface 15a) between the inner face and the outer face, and the second face (the bottom surface 15b) opposite to the first face. The outer face has at least one gas inlet (the gas inlet 16). The first face has an outer groove (the groove 151a) in communication with at least one gas inlet. The second face has first and second middle grooves (the grooves 152a and 153a) in communication with the outer groove. The first face further has first to fourth inner grooves (the grooves 156a to 159a) disposed medial to the outer groove. The first and second inner grooves (the grooves 156a and 157a) are in communication with the first middle groove (the grooves 152a), and the third and fourth inner grooves (the grooves 158a and 159a) are in communication with the middle groove (the groove 153a). The inner face has a plurality of gas outlets (the gas outlets 171 to 178). Each of the gas outlets is in communication with any one of the first to fourth inner grooves. Accordingly, a compact gas supply ring having a plurality of flow paths is provided. Further, the plurality of flow paths can be easily cleaned.

In accordance with the present embodiment, the gas outlets include first to eighth gas outlets (the gas outlets 171 to 178). The first and second gas outlets (the gas outlets 171 and 172) are in communication with the first inner groove (the groove 156a), and the third and fourth gas outlets (the gas outlets 173 and 174) are in communication with the second inner groove (the groove 157a). The fifth and sixth gas outlets (the gas outlets 175 and 176) are in communication with the third inner groove (the groove 158a). The seventh and eighth gas outlets (the gas outlets 177 and 178) is in communication with the fourth inner groove (the groove 159a). As a result, the gas can be supplied into the plasma generation chamber 12.

In accordance with the present embodiment, the first and second middle grooves (the grooves 152a and 153a) overlap with the outer groove (the groove 151a) in plan view. Accordingly, a plurality of flow paths can be provided in a compact manner in the radial direction of the gas ring 15. Further, even when it is required to obtain a uniform conductance, a tournament type flow path can be formed in a compact manner.

Further, in accordance with the present embodiment, the first middle groove (the groove 152a) overlaps with the first and second inner grooves (the grooves 156a and 157a) in plan view, and the second middle groove (the groove 153a) overlaps with the third and fourth inner grooves (the grooves 158a and 159a) in plan view. As a result, a plurality of flow paths can be provided in a compact manner in the radial direction of the gas ring 15. Further, even when it is required to obtain a uniform conductance, a tournament type flow path can be formed in a compact manner.

Further, in accordance with the present embodiment, the outer groove (the groove 151a) has an arcuate shape having a first radius. The first and second middle grooves (the grooves 152a and 153a) have an arcuate shape having a second radius smaller than the first radius. The first to fourth inner grooves (the grooves 156a to 159a) have an arcuate shape having a second radius. As a result, a plurality of flow paths can be provided in a compact manner in the radial direction of the gas ring 15. Further, even when it is required to obtain a uniform conductance, a tournament type flow path can be formed in a compact manner.

Further, in accordance with the present embodiment, each of the first and second inner grooves (the grooves 156a and 157a) is in communication with the first middle groove (the groove 152a) through vertical through holes (the flow paths 160 and 161), and each of the third and fourth inner grooves (the grooves 158a and 159a) is in communication with the second middle groove (the groove 153a) through vertical through holes (the flow paths 162 and 163). As a result, a compact gas supply ring having a plurality of flow paths is provided.

Further, in accordance with the present embodiment, the outer groove (the groove 151a) has an arcuate shape having a first radius. The first and second middle grooves (the grooves 152a and 153a) have an arcuate shape having a first radius. The first to fourth inner grooves (the grooves 156a to 159a) have an arcuate shape having a second radius smaller than the first radius. As a result, a plurality of flow paths can be provided in a compact manner in the radial direction of the gas ring 15. Further, even when it is required to obtain a uniform conductance, a tournament type flow path can be formed in a compact manner.

Further, in accordance with the present embodiment, each of the first and second middle grooves (the grooves 152a and 153a) is in communication with the outer groove (the groove 151a) through vertical through holes (the flow paths 154 and 155). As a result, a compact gas supply ring having a plurality of flow paths is provided.

Further, in accordance with the present embodiment, the outer groove (the groove 151a) has a central portion connected to at least one gas inlet (the gas inlet 16). The outer groove (the groove 151a) has a first end connected to the central portion of the first middle groove (the 152a) and a second end connected to the central portion of the second middle groove (the groove 153a). As a result, a compact gas supply ring having a plurality of flow paths is provided. Further, the conductance of fluid can be uniform in the plurality of flow paths.

Further, in accordance with the present embodiment, the first middle groove (the groove 152a) has a first end connected to the central portion of the first inner groove (the inner groove 156a) and a second end connected to the central portion of the second inner groove (the groove 157a). Further, the second middle groove (the groove 153a) may have a first end connected to the central portion of the third inner groove (the groove 158a) and a second end connected to the central portion of the fourth inner groove (the groove 159a). As a result, a compact gas supply ring having a plurality of flow paths is provided. Further, the conductance of fluid can be uniform in the plurality of flow paths.

Further, in accordance with the present embodiment, the gas supply ring (the gas ring 15) for supplying a gas into the chamber (the reaction chamber 13) of the substrate processing apparatus 10 has the inner face, the outer face, the first face (the upper surface 15a) that connects the inner face and the outer face, and the second face (the bottom surface 15b) that connects the inner face and the outer face and opposite to the first face. The outer face has at least one gas inlet 16 configured to introduce a gas into the gas supply ring from an exterior. The inner face has the plurality of gas outlets 171 to 178 configured to discharge the gas introduced from at least one gas inlet into the chamber. The first face has a first arcuate groove (the groove 151a). The second face has the plurality of second arcuate grooves (the grooves 152a and 153a). The gas supply ring further has the plurality of through holes (the flow paths 154 and 155) brining the first arcuate groove into communication with the plurality of second arcuate grooves. The first arcuate groove and the plurality of second arcuate grooves are concentrically arranged on the first face and the second face. The central portion of the second arcuate groove is connected to the end of the first arcuate groove. The central portion of the first arcuate groove is in communication with at least one gas inlet, and each end of the plurality of second arcuate grooves is in communication with one of the plurality of gas outlets. As a result, a compact gas supply ring having a plurality of flow paths is provided.

Further, in accordance with the present embodiment, the plurality of gas outlets 171 to 178 are disposed at equal intervals along the circumferential direction of the gas supply ring. As a result, the gas can be uniformly supplied into the plasma generation chamber 12.

Further, in accordance with the present embodiment, the first arcuate groove (the groove 151a) extends over an angle of 180 degrees along the circumferential direction of the gas supply ring. As a result, the gas can be uniformly supplied into the plasma generation chamber 12.

Further, in accordance with the present embodiment, the second arcuate grooves (the grooves 152a and 153a) extend over an angle of 90 degrees along the circumferential direction. As a result, the gas can be uniformly supplied into the plasma generation chamber 12.

Further, in accordance with the present embodiment, the substrate processing apparatus 10 includes the substrate processing chamber (the reaction chamber 13) having the first annular member (the substantially annular member 17) and the second annular member (the sidewall of the reaction chamber 13), and the gas supply ring (the gas ring 15) disposed between the first annular member and the second annular member and configured to supply a gas into the substrate processing chamber. The gas supply ring has the inner face, the outer face, the first face (the upper surface 15a) facing the first annular member, and the second face (the bottom surface 15b) facing the second annular member. The outer face has at least one gas inlet 16 configured to introduce a gas into the gas supply ring from an exterior. The inner face has the plurality of gas outlets 171 to 178 configured to discharge the gas introduced from at least one gas inlet 16. The first face has the first arcuate groove (the groove 151a). The second face has the plurality of second arcuate grooves (the grooves 152a and 153a). The gas supply ring further has the plurality of through holes (the flow paths 154 and 155) bringing the first arcuate groove into communication with the plurality of second arcuate grooves. The first annular member and the first arcuate groove define the first flow path (the flow path 151). The second annular member and the plurality of second arcuate grooves define the plurality of second flow paths (the flow paths 152 and 153). The first flow path and the plurality of second flow paths are concentrically arranged. The central portion of the second flow path is connected to the end of the first flow path. The central portion of the first flow path is in communication with at least one gas inlet 16, and each of the plurality of gas outlets 171 to 178 is in communication with an end of any one of the plurality of second flow paths. As a result, a plasma processing apparatus including a compact gas supply ring having a plurality of flow paths is provided. Further, since the conductance can be uniform in the plurality of flow paths, the gas can be uniformly supplied into the plasma generation chamber 12.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

In the above-described embodiment, the substrate processing apparatus 10 for performing plasma processing on the wafer W using inductively coupled plasma as a plasma source has been described as an example. However, the present disclosure is not limited thereto. The plasma source is not limited to the inductively coupled plasma as long as the apparatus processes the wafer W using plasma. For example, any plasma source such as capacitively coupled plasma, microwave plasma, magnetron plasma, or the like can be used.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A gas supply ring for use in a substrate processing apparatus, comprising:
    an inner face on a radially inner side of the gas supply ring;
    an outer face on a radially outer side of the gas supply ring;
    a first face between the inner face and the outer face on a first side of the gas supply ring; and
    a second face between the inner face and the outer face on a second side of the gas supply ring, the second side being opposite to the first side such that the first and second faces are on opposite sides of the gas supply ring with respect to each other, wherein the outer face has at least one gas inlet, the first face has an outer groove in communication with the at least one gas inlet, the second face has first and second middle grooves in communication with the outer groove, the first face further has first to fourth inner grooves disposed medial to the outer groove, the first and second inner grooves are in communication with the first middle groove, the third and fourth inner grooves are in communication with the second middle groove, the inner face has a plurality of gas outlets, and each of the gas outlets is in communication with at least one of the first to fourth inner grooves.

2. The gas supply ring set forth in claim 1, wherein the gas outlets comprise a first to eighth gas outlets, the first and second gas outlets are in communication with the first inner groove, the third and fourth gas outlets are in communication with the second inner groove, the fifth and sixth gas outlets are in communication with the third inner groove, and the seventh and eighth gas outlets are in communication with the fourth inner groove.

3. The gas supply ring set forth in claim 1, wherein each of the first and second middle grooves overlaps with the outer groove in plan view.

4. The gas supply ring set forth in claim 1, wherein the first middle groove overlaps with the first and second inner grooves in plan view, and the second middle groove overlaps with the third and fourth inner grooves in plan view.

5. The gas supply ring set forth in claim 1, wherein the outer groove has an arcuate shape with a first radius, each of the first and second middle grooves has an arcuate shape with a second radius smaller than the first radius, and each of the first to fourth inner grooves has an arcuate shape with the second radius.

6. The gas supply ring set forth in claim 5, wherein each of the first and second inner grooves is in communication with the first middle groove through a vertical through hole, and each of the third and fourth inner grooves is in communication with the second middle groove through a vertical through hole.

7. The gas supply ring set forth in claim 1, wherein the outer groove has an arcuate shape with a first radius, each of the first middle groove and the second middle groove has an arcuate shape with the first radius, and each of the first to fourth inner grooves has an arcuate shape with a second radius smaller than the first radius.

8. The gas supply ring set forth in claim 7, wherein each of the first and second middle grooves is in communication with the outer groove through a vertical through hole.

9. The gas supply ring set forth in claim 1, wherein the outer groove has a central portion connected to the at least one gas inlet, and the outer groove has a first end connected to a central portion of the first middle groove and a second end connected to a central portion of the second middle groove.

10. The gas supply ring set forth in claim 9, wherein the first middle groove has a first end connected to a central portion of the first inner groove and a second end connected to a central portion of the second inner groove, and the second middle groove has a first end connected to a central portion of the third inner groove and a second end connected to a central portion of the fourth inner groove.

11. A gas supply ring for supply of gas into a chamber of a substrate processing apparatus, comprising:

an inner face on a radially inner side of the gas supply ring, an outer face on a radially outer side of the gas supply ring, a first face between the inner face and the outer face on a first side of the gas supply ring, and a second face between the inner face and the outer face on a second side of the gas supply ring, the second side being opposite to the first side such that the first and second faces are on opposite sides of the gas supply ring with respect to each other, wherein the outer face has at least one gas inlet to introduce gas from an exterior into the gas supply ring, the inner face has a plurality of gas outlets to discharge the gas introduced from the at least one gas inlet into the chamber, the first face has a first arcuate groove, the second face has a plurality of second arcuate grooves, the gas supply ring further has a plurality of through holes bringing the first arcuate groove into communication with the second arcuate grooves, respectively, the first arcuate groove and the second arcuate grooves are concentrically disposed, central portions of the second arcuate grooves are connected to both ends of the first arcuate groove, a central portion of the first arcuate groove is in communication with the at least one gas inlet, and each end of the second arcuate grooves is in communication with one of the gas outlets.

12. The gas supply ring set forth in claim 11, wherein the plurality of gas outlets are circumferentially aligned at an equal interval.

13. The gas supply ring set forth in claim 11, wherein the first arcuate groove extends over an angle of 180 degrees in a circumferential direction of the gas supply ring.

14. The gas supply ring set forth in claim 13, wherein each of the second arcuate grooves extends over an angle of 90 degrees in the circumferential direction of the gas supply ring.

15. A substrate processing apparatus comprising:

a substrate processing chamber including a first annular member and a second annular member; and a gas supply ring disposed between the first annular member and the second annular member, the gas supply ring being configured to supply gas into an interior of the chamber, wherein the gas supply ring has an inner face on a radially inner side of the gas supply ring, an outer face on a radially outer side of the gas supply ring, a first face facing the first annular member on a first side of the gas supply ring, and a second face facing the second annular member on a second side of the gas supply ring, the second side being opposite to the first side such that the first and second faces are on opposite sides of the gas supply ring with respect to each other, the outer face has at least one gas inlet to introduce the gas from an exterior into the gas supply ring, the inner face has a plurality of gas outlets to discharge the gas introduced from the at least one gas inlet,
the first face has a first arcuate groove,
the second face has a plurality of second arcuate grooves,
the gas supply ring further includes a plurality of through holes bringing the first arcuate groove into communication with the second arcuate grooves,
the first annular member and the first arcuate groove define a first flow path, the second annular member and the second arcuate grooves define a plurality of second flow paths,
the first flow path and the second flow paths are concentrically disposed,
each of central portions of the second flow paths is connected to one end of the first flow path,
a central portion of the first flow path is in communication with the gas inlet, and
each of the gas outlets is in communication with one end of the second flow paths.

16. The gas supply ring set forth in claim 1, wherein:
the outer groove extends from a surface of the first face,
the first and second middle grooves extend from a surface of the second face, and
the first to fourth inner grooves extend from the surface of the first face.

17. The gas supply ring set forth in claim 11, wherein:
the first arcuate groove extends from a surface of the first face,
the plurality of second arcuate grooves extend from a surface of the second face, and
the gas supply ring further including a plurality of inner grooves which extend from the surface of the first face.

18. The substrate processing apparatus set forth in claim 15, wherein:
the first arcuate groove extends from a surface of the first face,
the plurality of second arcuate grooves extend from a surface of the second face, and
the gas supply ring further includes a plurality of inner grooves which extend from the surface of the first face.

19. The substrate processing apparatus according to claim 18, wherein one of the first side or the second side is a top side of the gas supply ring and the other of the first side or the second side is a bottom side of the gas supply ring.

20. The substrate processing apparatus set forth in claim 18, wherein the first side is a top side of the gas supply ring and the second side is a bottom side of the gas supply ring.

* * * * *